(12) United States Patent
Chyan et al.

(10) Patent No.: US 6,537,887 B2
(45) Date of Patent: Mar. 25, 2003

(54) INTEGRATED CIRCUIT FABRICATION

(75) Inventors: Yih-Feng Chyan, New Providence, NJ (US); Chung Wai Leung, Orlando, FL (US); Yi Ma, Orlando, FL (US); Demi Nguyen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 45 days.

(21) Appl. No.: 09/727,325

(22) Filed: Nov. 30, 2000

(65) Prior Publication Data

US 2002/0063308 A1 May 30, 2002

(51) Int. Cl.7 .......................................... H01L 21/8222
(52) U.S. Cl. ................... 438/309; 438/170; 438/189; 438/234; 438/235; 438/236; 438/423; 438/440; 438/506; 257/555; 257/557; 257/565
(58) Field of Search ........................... 438/309, 506, 438/440, 170, 189, 234, 235, 236, 423; 257/565, 555, 557

(56) References Cited

U.S. PATENT DOCUMENTS

| | | | | |
|---|---|---|---|---|
| 5,789,305 A | * | 8/1998 | Peidous | 438/439 |
| 6,194,288 B1 | * | 2/2001 | Fahn | 438/440 |
| 6,372,585 B1 | * | 4/2002 | Yu | 438/301 |
| 6,372,596 B1 | * | 4/2002 | Havemann | 438/338 |

* cited by examiner

*Primary Examiner*—Tom Thomas
*Assistant Examiner*—Thomas Magee

(57) ABSTRACT

An integrated circuit and a process for making the same are provided. The circuit has a nitrogen implanted emitter window, wherein the nitrogen has been implanted into the emitter window after the emitter window etch, but prior to the emitter conductor deposition. Nitrogen implantation is expected to minimize oxide growth variation.

13 Claims, 4 Drawing Sheets

INTEGRATED CIRCUIT FABRICATION

FIELD OF THE INVENTION

This invention relates, in general, to semiconductor integrated circuit technology and, in an illustrative embodiment, to integrated circuits that include bipolar or BiCMOS devices.

BACKGROUND OF THE INVENTION

Many modern integrated circuits utilize both bipolar and MOSFET (e.g., CMOS, NMOS, or PMOS) devices on a single chip. Such integrated circuits (when they combine bipolar and CMOS) are often termed "BiCMOS". Fabrication of BiCMOS (or even BiNMOS or BiPMOS) integrated circuits poses special problems for the process designer because certain process steps (e.g., heating, deposition, etching, etc.) that may facilitate formation of bipolar devices may adversely effect formation of MOS devices.

One common problem with integrated circuit fabrication is the unwanted growth of oxide, specifically around window devices. Suppressing or suspending oxide growth around the window area should improve the uniformity of the wafers containing these devices. However, current means of suppressing or suspending oxide growth involve using low temperature (450° C.) during the wafer push into the furnace followed by high temperature (615° C.) for emitter poly deposition. These techniques are flawed in that they decrease wafer throughput and shorten furnace lifetimes.

Those concerned with the development of integrated circuit technology have consistently sought improved methods of integrated circuit fabrication. In order to increase throughput and uniformity, it is desirable to discover new methods of suppressing or suspending oxide growth during circuit fabrication.

SUMMARY OF THE INVENTION

Accordingly, the present invention provides an integrated circuit with a nitrogen implanted emitter window.

The present invention also provides a method of making an integrated circuit with minimal oxide growth wherein nitrogen is implanted into the emitter window after the emitter window etch, but prior to emitter conductor deposition.

DESCRIPTION OF THE DRAWINGS

Turning to FIG. 1, reference numeral 11 denotes a substrate wherein features of the substrate, if present, are not shown.

In FIG. 2, a dielectric 16 is formed over the substrate.

In FIG. 3, a first conductor 17 is formed over the dielectric.

In FIG. 4, a patterned photoresist 18 is formed over conductor 17.

In FIG. 5, conductor 17 is removed to open a window 18 for an emitter device. FIG. 5 shows that part of dielectric 16 is removed when conductor 17 is removed.

In FIG. 6, nitrogen implantation, illustrated by perpendicular hatching 19, proceeds through the window formed in 18. The hatching 19 in FIG. 6 shows that nitrogen implantation occurs in dielectric 16 and an upper portion of substrate 11.

In FIG. 7, photoresist 18 is removed and the remaining dielectric is removed.

In FIG. 8, a second conductor 20 is formed over the exposed surface of the first conductor 17 and the substrate 11.

DETAILED DESCRIPTION OF PREFERRED EMBODIMENTS

It has been discovered that implanting nitrogen into the emitter window after the emitter window etch, but prior to emitter conductor deposition can minimize oxide growth variation. Consequently, the present invention provides a device with a window area wherein the oxide growth is suppressed or suspended. Suppressing or suspending oxide growth around the window area should improve the uniformity of the wafers containing these devices. The present invention also should extend poly furnace lifetimes as it avoids the known practice of using low temperature (450° C.) during the wafer push into the furnace followed by high temperature (615° C.) for emitter poly deposition.

Figure 1:
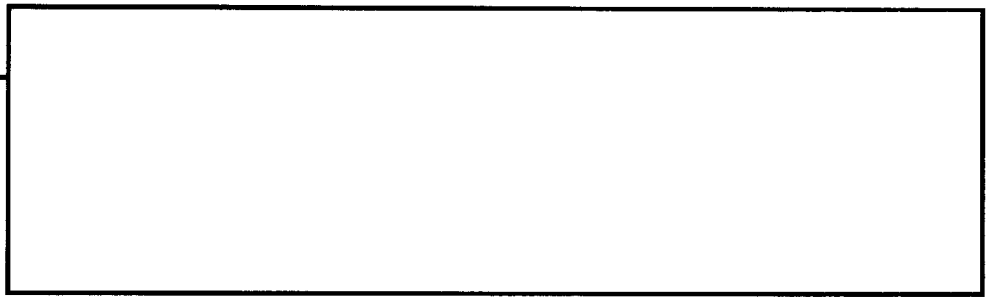
FIGS. 1–8 are cross-sectional views of a partially fabricated integrated circuit formed according to illustrative embodiments of the present invention.
Figure 2:
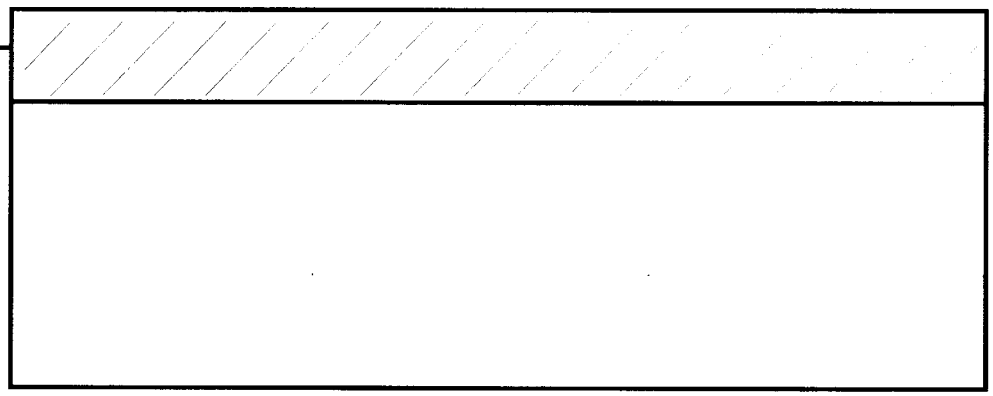
Figure 3:
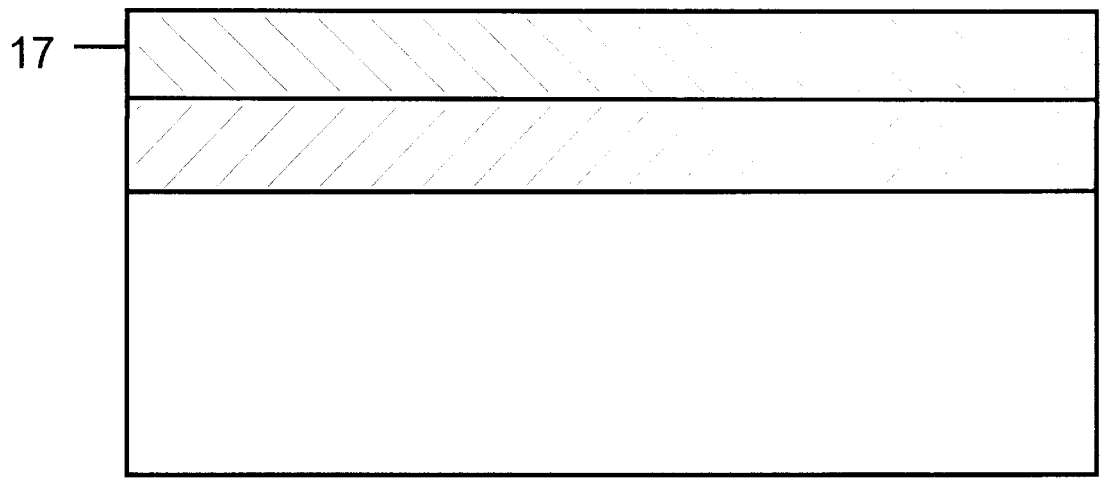
Figure 4:
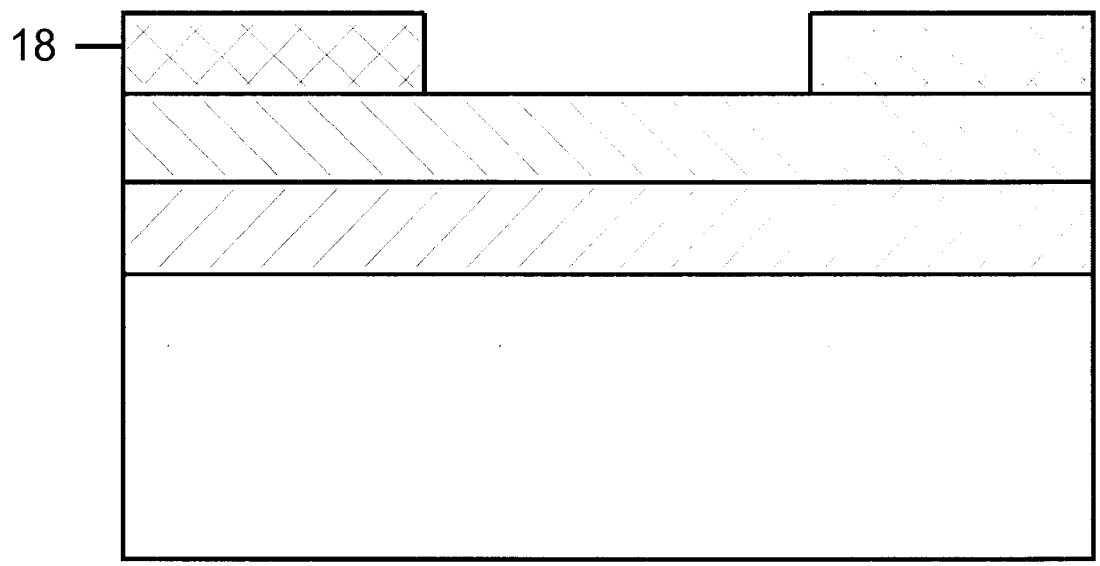
Figure 5:
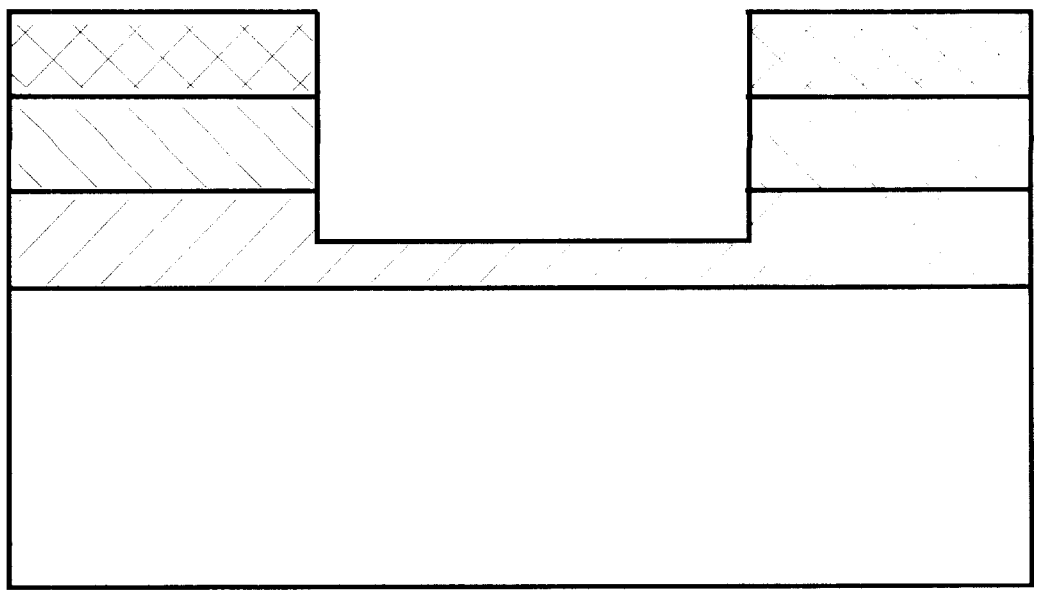

The substrate, reference numeral 11 in FIG. 1, is typically, silicon, doped silicon, epitaxial silicon, etc. It may be assumed that appropriate field oxides or other isolation structures may have already been formed (although they are not shown). Such isolations may serve, for example, to separate n-wells and p-wells for NMOS and PMOS devices (in a BiCMOS circuit) and/or also to separate the subsequently formed bipolar devices.

Dielectric 16, which is formed over the substrate, is preferably an oxide of silicon. For example, dielectric 16 may be formed from TEOS or plasma enhanced TEOS (PETEOS). A thickness of about 1600 Å for dielectric 16 is preferable. One of ordinary skill in the art may choose other thicknesses for dielectric 16 depending upon the device being fabricated. For example, thicknesses of from 400, 500, 600, 700, 800, 900, 1000, 1100, 1200, 1300, 1400, 1500, 1600, 1700, 1800, 1900, to 2000 Å may be selected, preferably from 600, 700, 800, 900, 1000, 1100, 1200, 1300, 1400, 1500, to 1600 Å. Dielectric 16 may be partially etched by an anisotropic plasma etch. For example, if the initial thickness of dielectric 16 is approximately 1600 Å, then approximately 1000 Å of dielectric may be removed via etching, leaving approximately 600 Å of dielectric 16. The amount of dielectric removed will depend up the device being fabricated.

Approximately 600 Å of conductor 17 is formed over dielectric 16. Other thicknesses of the first conductor 17 may also be chosen depending upon the device being fabricated. For example, thicknesses of from 300, 400, 500, 600, 700, 800, 900, to 1000 Å may be selected. First conductor 17 is preferably poly silicon or amorphous silicon.

A patterned photoresist 18 is formed over first conductor 17 by standard methods known to those of skill in the art. Then, the unmasked portion of the first conductor 17 is removed, preferable by dry etching, to open a window 18 for an emitter device. It is noted that this etching will usually remove part of the dielectric 16 as well as conductor 17.

Figure 6:
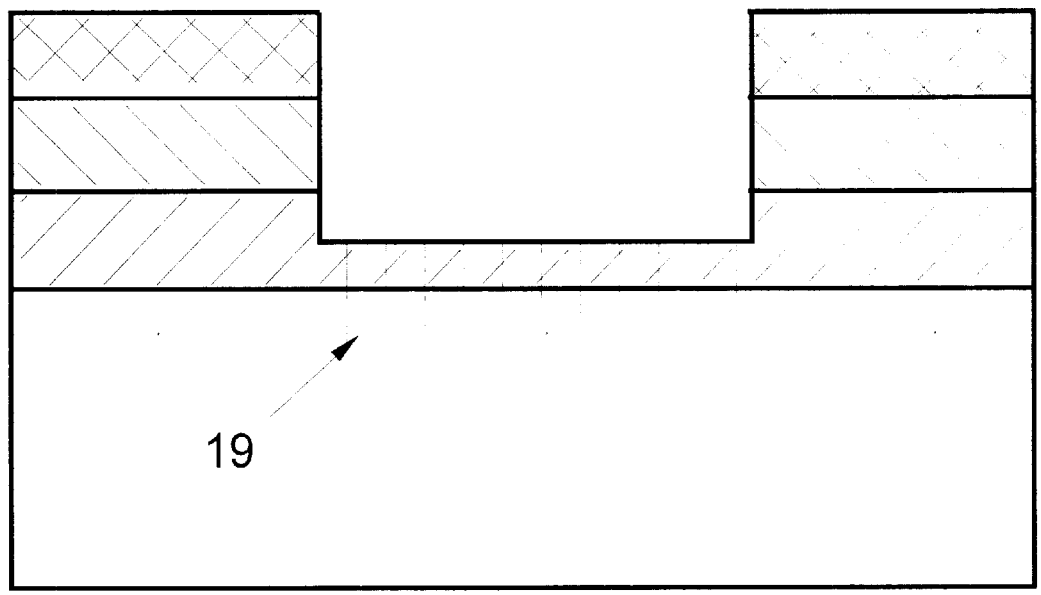
Figure 7:
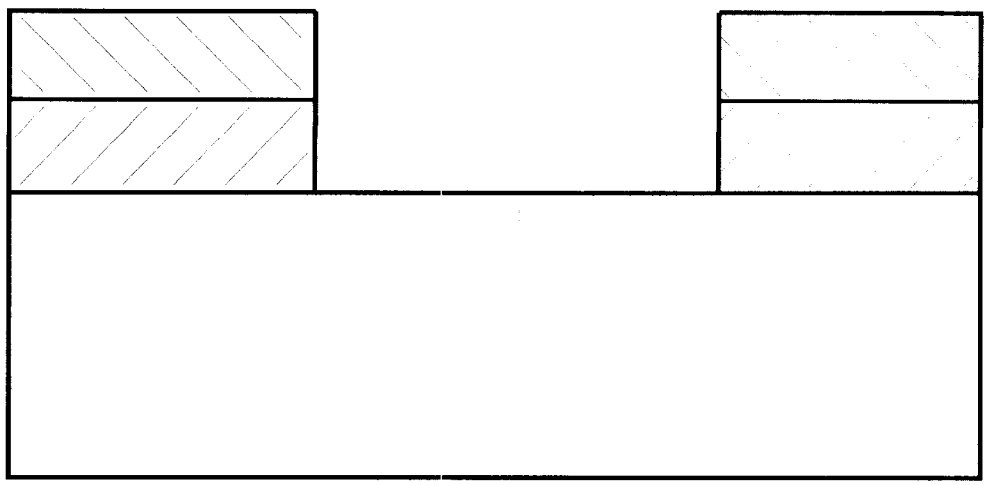
Figure 8:
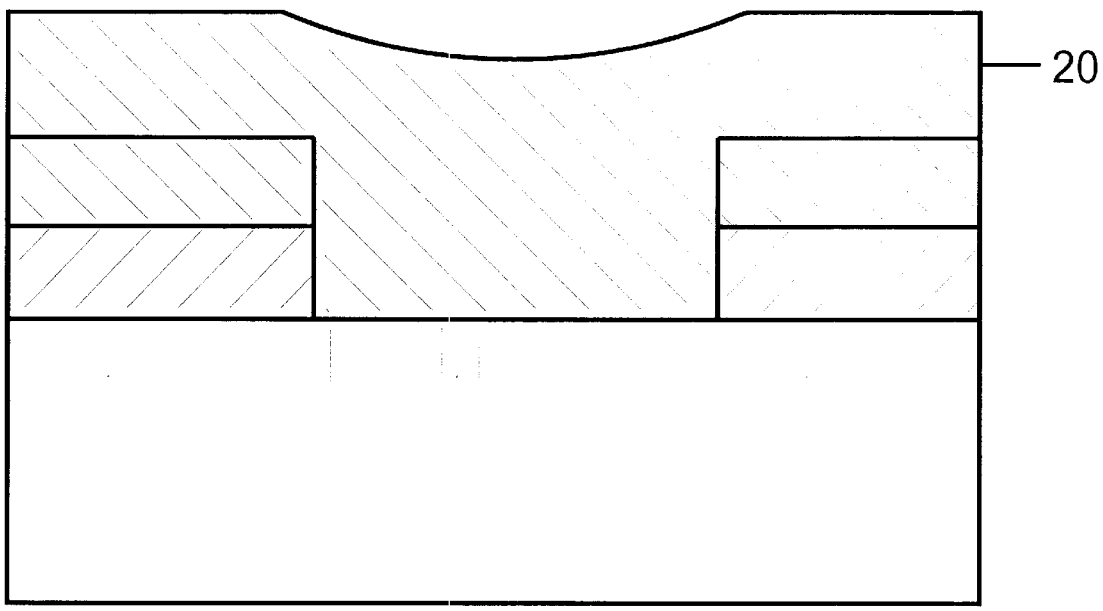

Once the window is open, nitrogen implantation is effected through this window. Nitrogen implantation is conducted using standard methods known to those of skill in the art. The implantation occurs in the dielectric, and preferably in at least a part of the upper portion of the substrate (e.g., hatching 19 in FIG. 6).

After nitrogen implantation, photoresist 18 is removed. At this time, it is preferable to remove any remaining dielectric 16. This can be accomplished using standard means, such as a wet etch. As a result, the nitrogen-implanted window is located between the first conductor and dielectric layers.

Next, a second conductor 20 is formed over the exposed surface. Preferably, the exposed surface comprises the first conductor and the substrate. Second conductor 20 is preferably poly silicon or amorphous silicon. More preferably, the second conductor is poly silicon. Preferably about 1,800, 2,000, 2,200, 2400, 2,600, 2,800, 3,000, to 3,200, Å of second conductor are formed. More preferably, about 2,400 Å of poly silicon are formed.

Conventional bipolar processing, BiCMOS processing, or both types of processing can take place at this point. Such conventional processing can include deposition of a dielectric, opening of windows in the dielectric, and deposition of conductive contacts.

Obviously, numerous modifications and variations of the present invention are possible in light of the above teachings. It is therefore to be understood that within the scope of the appended claims, the invention may be practiced otherwise that as specifically described herein.

What is claimed is:

1. A method of forming a bipolar transistor, comprising:
   positioning a dielectric layer over a substrate;
   locating a conductive layer over said dielectric layer;
   forming a window through at least said conductive layer;
   implanting nitrogen into said substrate through said window; and
   placing an emitter layer at least partially in said window subsequent to implanting said nitrogen.

2. The method recited in claim 1 wherein said forming includes forming said window through said conductive layer and partially through said dielectric layer.

3. The method recited in claim 1 wherein said implanting includes implanting through at least a portion of said dielectric layer.

4. The method recited in claim 1 wherein said forming includes forming a patterned resist over said conductive layer.

5. The method recited in claim 1 wherein said forming said window exposes a portion of said dielectric layer, and further comprising removing said exposed portion of said dielectric layer to expose a portion of said substrate.

6. The method recited in claim 1 wherein said dielectric layer has a thickness ranging from about 600 Å to about 1600 Å.

7. The method recited in claim 1 wherein said dielectric layer is formed from TEOS and is about 1600 Å thick.

8. The method recited in claim 1 wherein said conductive layer has a thickness ranging from about 300 Å to about 1000 Å.

9. The method recited in claim 1 wherein said conductive layer comprises poly silicon or amorphous silicon.

10. The method recited in claim 1 wherein said conductive layer comprises poly silicon and is about 600 Å thick.

11. The method recited in claim 1 wherein said emitter layer has a thickness ranging from about 1800 Å to about 3200 Å.

12. The method recited in claim 1 wherein said emitter layer comprises poly silicon or amorphous silicon.

13. The method recited in claim 1 wherein said emitter layer comprises polysilicon and is about 2400 Å thick.

* * * * *